US011056198B2

(12) United States Patent
Muchherla et al.

(10) Patent No.: US 11,056,198 B2
(45) Date of Patent: *Jul. 6, 2021

(54) READ DISTURB SCAN CONSOLIDATION

(71) Applicant: Micron Technology, Inc., Boise, ID (US)

(72) Inventors: Kishore Kumar Muchherla, Fremont, CA (US); Ashutosh Malshe, Fremont, CA (US); Harish R. Singidi, Fremont, CA (US); Shane Nowell, Boise, ID (US); Vamsi Pavan Rayaprolu, San Jose, CA (US); Sampath K. Ratnam, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/741,198

(22) Filed: Jan. 13, 2020

(65) Prior Publication Data

US 2020/0152280 A1  May 14, 2020

Related U.S. Application Data

(63) Continuation of application No. 16/175,657, filed on Oct. 30, 2018, now Pat. No. 10,553,290.

(51) Int. Cl.
*G11C 16/26* (2006.01)
*G11C 16/34* (2006.01)
(Continued)

(52) U.S. Cl.
CPC ...... *G11C 16/3418* (2013.01); *G06F 11/1048* (2013.01); *G06F 11/3037* (2013.01);
(Continued)

(58) Field of Classification Search
CPC ... G11C 16/3418; G11C 16/26; G11C 16/349; G06F 11/1048; G06F 11/3037
See application file for complete search history.

(56) References Cited

U.S. PATENT DOCUMENTS 7,954,037 B2   5/2011  Lasser et al.
9,195,584 B2   11/2015 Manohar et al.
(Continued)

FOREIGN PATENT DOCUMENTS

WO   2013191870 A1   12/2013
WO   2016069126 A1   5/2016

OTHER PUBLICATIONS

International Search Report and Written Opinion for International Application No. PCT/US2019/057709, dated Feb. 10, 2020, 10 pages.

(Continued)

*Primary Examiner* — Mushfique Siddique
(74) *Attorney, Agent, or Firm* — Lowenstein Sandler LLP

(57) ABSTRACT

A processing device in a memory system determines that a first metric of a first memory unit on a first plane of a memory device satisfies a first threshold criterion. The processing device further determines whether a second metric of a second memory unit on a second plane of the memory device satisfies a second threshold criterion, wherein the second block is associated with the first block, and wherein the second threshold criterion is lower than the first threshold criterion. Responsive to the second metric satisfying the second threshold criterion, the processing device performs a multi-plane data integrity operation to determine a first reliability statistic for the first memory unit and a second reliability statistic for the second memory unit in parallel.

20 Claims, 5 Drawing Sheets

(51) Int. Cl.
*G11C 29/52* (2006.01)
*G11C 29/42* (2006.01)
*G06F 11/30* (2006.01)
*G06F 11/10* (2006.01)

(52) U.S. Cl.
CPC ............ *G11C 16/26* (2013.01); *G11C 16/349* (2013.01); *G11C 29/42* (2013.01); *G11C 29/52* (2013.01); *G06F 2201/81* (2013.01)

(56) References Cited

U.S. PATENT DOCUMENTS

| | | | |
|---|---|---|---|
| 9,361,991 B1* | 6/2016 | Ng | G11C 16/0483 |
| 9,465,732 B2* | 10/2016 | Manohar | G06F 12/0246 |
| 9,535,620 B2 | 1/2017 | Kim et al. | |
| 9,595,320 B2 | 3/2017 | Wu et al. | |
| 10,115,472 B1 | 10/2018 | Camp et al. | |
| 10,170,195 B1 | 1/2019 | Ioannou et al. | |
| 10,403,373 B2 | 9/2019 | Akamine et al. | |
| 10,553,290 B1* | 2/2020 | Muchherla | G06F 11/3037 |
| 2013/0346805 A1* | 12/2013 | Sprouse | G11C 16/3431 714/42 |
| 2014/0136883 A1* | 5/2014 | Cohen | G11C 16/349 714/6.11 |
| 2014/0204671 A1 | 7/2014 | Sharon et al. | |
| 2015/0100847 A1 | 4/2015 | Ojalvo et al. | |
| 2015/0154089 A1 | 6/2015 | Wu et al. | |
| 2015/0261604 A1 | 9/2015 | Sugiyama et al. | |
| 2015/0262712 A1* | 9/2015 | Chen | G11C 29/42 714/723 |
| 2015/0262714 A1 | 9/2015 | Tuers et al. | |
| 2016/0077749 A1* | 3/2016 | Ravimohan | G06F 3/0688 711/103 |
| 2016/0343449 A1* | 11/2016 | Lee | G11C 11/5635 |
| 2017/0221569 A1 | 8/2017 | Akamine et al. | |
| 2017/0345510 A1 | 11/2017 | Achtenberg et al. | |
| 2018/0018233 A1 | 1/2018 | Kim et al. | |
| 2018/0053562 A1 | 2/2018 | Reusswig et al. | |
| 2018/0175889 A1 | 6/2018 | Bazarsky et al. | |
| 2018/0189135 A1 | 7/2018 | Naik et al. | |
| 2018/0293002 A1 | 10/2018 | Bradshaw | |
| 2019/0018733 A1 | 1/2019 | Moschiano et al. | |
| 2019/0057026 A1* | 2/2019 | Park | G06F 3/0659 |
| 2019/0066739 A1 | 2/2019 | Muchherla et al. | |
| 2019/0107963 A1 | 4/2019 | Bradshaw | |
| 2019/0278510 A1 | 9/2019 | Kaynak et al. | |
| 2019/0278655 A1 | 9/2019 | Koudele et al. | |
| 2019/0347192 A1* | 11/2019 | Hsiao | G06F 12/0246 |

OTHER PUBLICATIONS

Yu Cai et al., "Errors in Flash-Memory-Based Solid-State Drives: Analysis, Mitigation, and Recovery", arXiv 1711.11427v2, Jan. 5, 2018, 86 pages.

* cited by examiner

READ DISTURB SCAN CONSOLIDATION

RELATED APPLICATIONS

This application is a continuation of U.S. patent application Ser. No. 16/175,657, filed Oct. 30, 2018, the entire contents of which are hereby incorporated by reference herein.

TECHNICAL FIELD

Embodiments of the disclosure relate generally to memory sub-systems, and more specifically, relate to managing a memory sub-system including memory components with different characteristics.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
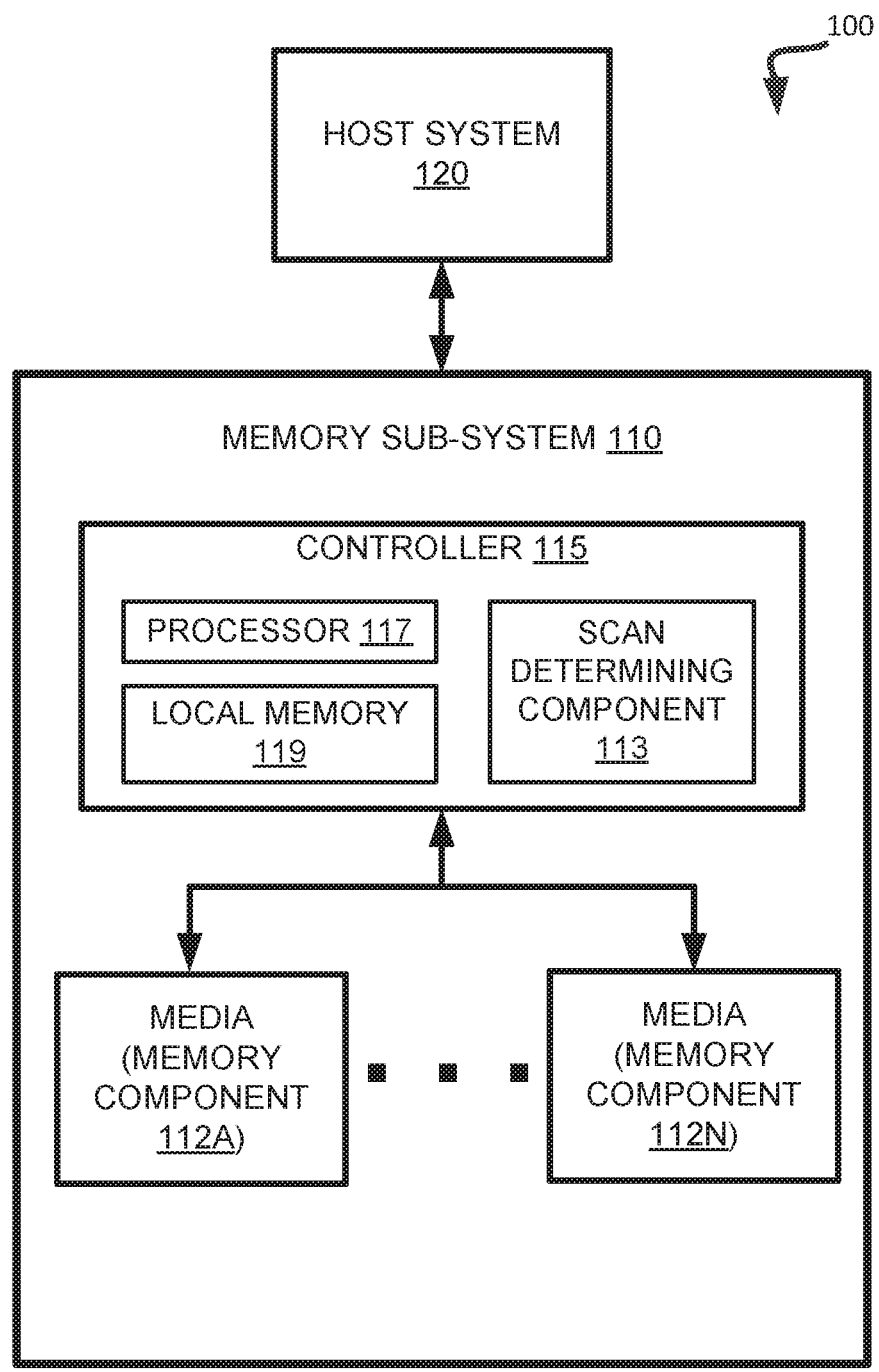
FIG. 1 illustrates an example computing environment that includes a memory sub-system in accordance with some embodiments of the present disclosure.

Aspects of the present disclosure are directed to read disturb scan consolidation across multiple planes of a memory component to minimize system bandwidth penalty in a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

A memory component in a memory sub-system can include memory cells that can include one or more memory pages (also referred to herein as "pages") for storing one or more bits of binary data corresponding to data received from the host system. One or more memory cells of the memory component can be grouped together to form a data block. One or more data blocks can be grouped together to form a plane of the memory component in order to allow concurrent operations to take place on each plane. When data is written to a memory cell of the memory component for storage, the memory cell can deteriorate. Accordingly, each memory cell of the memory component can handle a finite number of write operations performed before the memory cell is no longer able to reliably store data. Data stored at the memory cells of the memory component can be read from the memory component and transmitted to a host system. When data is read from a memory cell of the memory component, nearby or adjacent memory cells can experience what is known as read disturb. Read disturb is the result of continually reading from one memory cell without intervening erase operations, causing other nearby memory cells to change over time (e.g., become programmed). If too many read operations are performed on a memory cell, data stored at adjacent memory cells of the memory component can become corrupted or incorrectly stored at the memory cell. This can result in a higher error rate of the data stored at the memory cell. This can increase the use of an error detection and correction operation (e.g., an error control operation) for subsequent operations (e.g., read and/or write) performed on the memory cell. The increased use of the error control operation can result in a reduction of the performance of a conventional memory sub-system. In addition, as the error rate for a memory cell or data block continues to increase, it may even surpass the error correction capabilities of the memory sub-system, leading to an irreparable loss of the data. Furthermore, as more resources of the memory sub-system are used to perform the error control operation, fewer resources can be used to perform other read operations or write operations.

The error rate associated with data stored at the data block can increase due to read disturb. Therefore, upon a threshold number of read operations being performed on the data block, the memory sub-system can perform a data integrity check (also referred to herein as a "scan") to verify that the data stored at the data block does not include any errors. During the data integrity check, one or more reliability statistics are determined for data stored at the data block. One example of a reliability statistic is raw bit error rate (RBER). The RBER corresponds to a number of bit errors per unit of time that the data stored at the data block experiences.

Conventionally, if the reliability statistic for a data block exceeds a threshold value, indicating a high error rate associated with data stored at the data block due, at least in part, to read disturb, then the data stored at the data block is relocated to a new data block of the memory sub-system (also referred to herein as "folding"). The folding of the data stored at the data block to the other data block can include writing the data to the other data block to refresh the data stored by the memory sub-system. This can be done to negate the effects of read disturb associated with the data and to erase the data at the data block. However, as previously discussed, read disturb can affect memory cells that are adjacent to the memory cell that a read operation is performed on. Therefore, read disturb can induce a non-uniform stress on memory cells of the data block if particular memory cells are read from more frequently. For example, memory cells of a data block that are adjacent to a memory cell that is frequently read from can have a high error rate, while memory cells that are not adjacent to the memory cell can have a lower error rate due to a reduced impact by read disturb on these memory cells.

A conventional memory sub-system performs a data integrity check at the block level using a single-plane scan operation. Since scan operations are performed at the block level, the memory sub-system monitors the number of read operations performed on a particular data block and performs a single-plane scan operation when the read count (i.e., the number of read operations) meets or exceeds a certain read threshold. The single-plane scan is limited to reading data from a data block on only one plane of the memory component. Scanning the block takes a certain amount of time (e.g., 100 microseconds) and transferring the data to the controller may take a certain amount of transfer time (e.g., 10 microseconds). If another data block on the same or another plane of the memory component has a read count that also meets or exceeds the read threshold, the memory sub-system initiates a separate single-plane scan operation after the previous scan operation is complete. Performing individual scans in this manner can result in the performance of excessive memory management operations by the memory sub-system. This can result in a decrease of performance of the memory sub-system, as well as an increase the power consumption of the memory sub-system. System bandwidth and other resources are also tied up for extended periods of time, preventing the use of those resources for other functionality.

Aspects of the present disclosure address the above and other deficiencies by having a memory sub-system that utilizes read disturb scan consolidation across multiple planes of a memory component to minimize the system bandwidth penalty in the memory sub-system. In one embodiment, when the memory sub-system determines that the read count of a memory block on one plane of a memory component reaches a first threshold (i.e., indicating that a scan or other integrity check should be performed), the memory sub-system determines whether any corresponding blocks in the other planes of the memory component (e.g., those blocks in a stripe across the planes of the memory component) have corresponding read counts that are relatively close to exceeding the first threshold. These other blocks may not have a count value that reaches the first threshold, and thus would not normally be eligible for a scan operation, but may be sufficiently close, such that their count values meet or exceed a second threshold that is approximately 10%-20% lower than the first threshold. It is likely that these other blocks will soon reach the first threshold, thereby triggering their own separate corresponding scan operations. In one embodiment, rather than waiting to perform separate scan operations, the memory sub-system can perform a multi-plane scan operation for the data blocks across multiple planes, or even all of the planes, of the memory component. The increase in scan time and transfer time when performing a multi-plane scan may be minimal when compared to performing a single-plane scan and the time and resource savings can be considerable when compared to performing multiple single-plane scans sequentially. For example, performing a multiplane scan of four planes of a memory component and Scanning the block takes a certain amount of time (e.g., 110 microseconds) and transferring the data to the controller may take a certain amount of transfer time (e.g., 10 microseconds for each plane). Thus, the total time for the multi-plane scan of all four planes may be approximately 150 microseconds, which is considerably less than performing even two individual single plane scans (e.g., 110 microseconds each). Thus, the memory controller will be occupied for less time when performing read disturb scans, thereby allowing more time for the controller to handle other data access operations for the memory component.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data. The data blocks can be further grouped into one or more planes on each of memory components 112A to 112N, where operations can be performed on each of the planes concurrently. Corresponding data blocks from different planes can be associated with one another in a stripe than spans across multiple planes.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a scan determining component 113 that can be used to determine when to perform a scan or other data integrity check on the data blocks of memory components 112A to 112N. In one embodiment, scan determining component 113 determines that a first read count of a first data block on a first plane of memory component 112A exceeds a first read threshold. Scan determining component 113 further determines whether a second read count of a second data block on a second plane of memory component 112A exceeds a second read threshold, wherein the second block is associated with the first block (e.g., as a part of a block stripe or superblock across multiple planes), and wherein the second read threshold is lower than the first read threshold (e.g., by 10%-20%). Responsive to the second read count exceeding the second read threshold, scan determining component 113 can perform a multi-plane scan to determine a first error rate for the first data block and a second error rate for the second data block in parallel. Depending on the embodiment, scan determining component 113 can determine error rates for data blocks on a subset or all of the planes of the memory component 112A as part of the multi-plane scan operation, even if all of those data blocks do not have a read count that exceeds the first read threshold. Upon determining the corresponding error rates, scan determining component 113 can determine whether any of the error rates exceed an error threshold and can relocate data from those data blocks and reset the read counts of those data blocks. Further details with regards to the operations of the scan determining component 113 are described below.

Figure 2A:
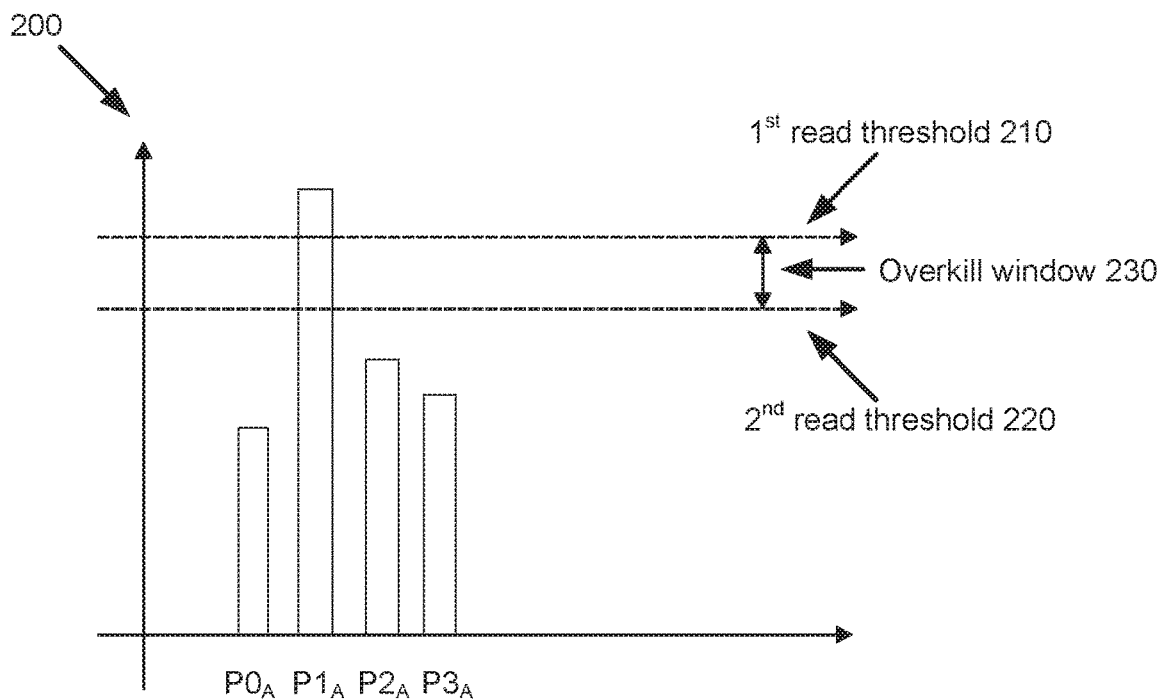
FIGS. 2A and 2B are graphs illustrating read disturb scan consolidation across multiple planes of a memory component in accordance with some embodiments of the present disclosure.
Figure 2B:
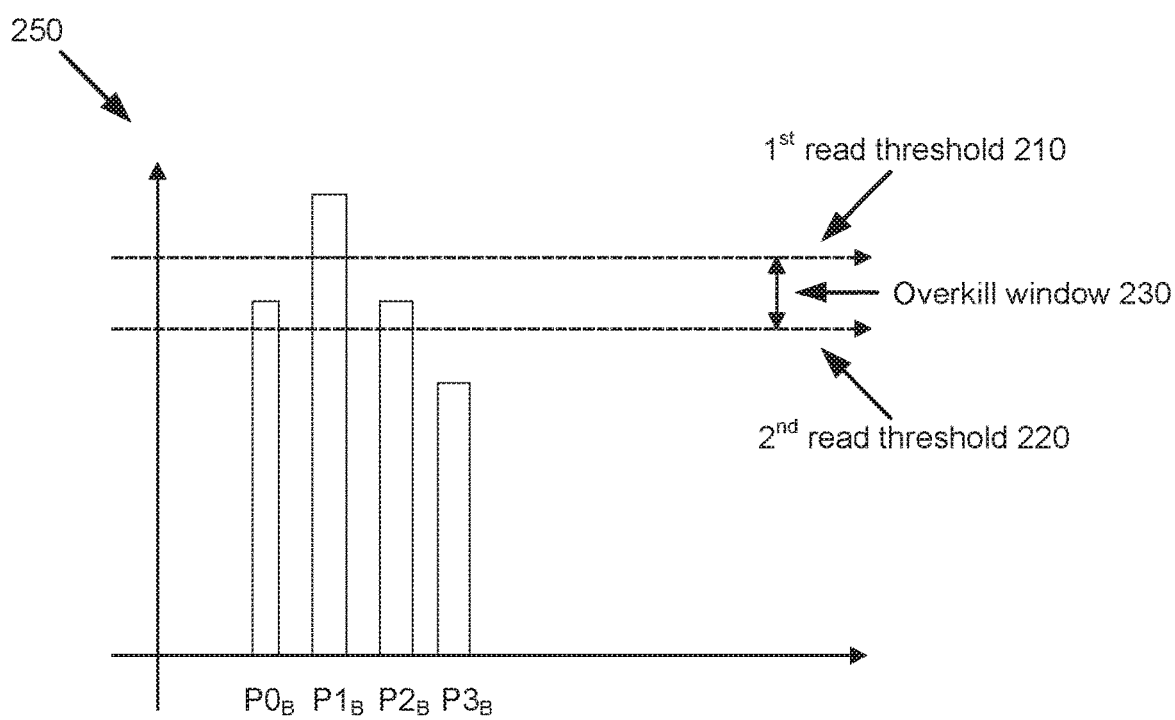

FIGS. 2A and 2B are graphs illustrating read disturb scan consolidation across multiple planes of a memory component in accordance with some embodiments of the present disclosure. Graph 200 in FIG. 2A illustrates read count values 205 for a group of associated data blocks across a number of planes in one of memory components 112A to 112N, such as memory component 112A, for example. In one embodiment, the associated data blocks are part of a stripe of data blocks across multiple planes of memory component 112A. This stripe may also be referred to as a super block. In the illustrated embodiment, memory component 112A has four separate planes P0, P1, P2, and P3. As described above, each plane is a group of data blocks from memory component 112A that are separated to allow operations to be performed on each plane concurrently. In other embodiments, a memory component can include some other number of planes, such as two planes, six planes, eight planes, etc. In graph 200, the read count values 205 are plotted in manner to illustrate the relative read counts for one block on each of planes P0, P1, P2, and P3. For example, the value $P0_A$ illustrates a particular read count of a data block on plane P0, the value $P1_A$ illustrates a particular read count of a data block on plane P1, the value $P2_A$ illustrates a particular read count of a data block on plane P2, and the value $P3_A$ illustrates a particular read count of a data block on plane P3, where each of these blocks are part of a stripe or super block. In one embodiment, controller 115 maintains a separate read count value for each data block on each of the planes P0, P1, P2, and P3 of memory component 112A. For example, controller 115 can include a counter corresponding to each data block that is incremented each time a read operation is performed on the corresponding data block. Thus, the read count values 205 indicate a number of times that each corresponding data block has been read since a previous scan operation was performed on the data block, at which time the counter was reset to an initial value (e.g., 0).

In one embodiment, scan determining component 113 monitors the read counts of each block on each of planes P0, P1, P2, and P3 of memory component 112A. Scan determining component 113 can compare those read counts to a first threshold criterion (i.e., a first read threshold 210). The first read threshold 210 may represent a number of read operations on a given memory block after which a scan or other data integrity check should be performed. The number of read operations of a data block is one indicator that the error rate of the data block may be increasing, and thus, after a certain number of read operations, the error rate can be determined by performing a scan operation. In one embodiment, the first read threshold 210 is a configurable number that can be determined based on the physical characteristics of the underlying memory component, requirements of the customer, etc. The first read threshold 210 may be set to an amount where an expected error rate after a certain number of read operations is approaching, but still below, an error correction capability of the memory component. For ease of explanation, the first read threshold 210 may be set at one million (1M) reads, although any other value may be used in practice. In the graph 200 of FIG. 2A, the value $P1_A$ exceeds the first read threshold 210, indicating that a corresponding first data block on plane P1 has a read count value that exceeds the first read threshold 210.

Upon determining that at least one read count exceeds the first read threshold 210, scan determining component 113 can determine the read counts of other data blocks associated with the first data block on plane P1. These other data blocks may be part of the same stripe of super block. Scan determining component 113 can compare those read counts to both the first read threshold 210 and a second threshold criterion (e.g., a second read threshold 220). The second read threshold 220 may represent a number of read operations on a given memory block which by itself would not trigger a scan, but indicates that the number of read operations is approaching that level. In one embodiment, the second read threshold 220 is a configurable number, which may be for example 10% to 20% less than the first read threshold 210. The different between the first read threshold 210 and the second read threshold 220 may be referred to as an overkill window 230. In other embodiments, the overkill window may represent 5%, 25%, 30%, 50%, or some other amount of the first read threshold 210. For ease of explanation, the second read threshold 220 may be set at nine hundred thousand (900k), although any other value may be used in practice. In the graph 200 of FIG. 2A, none of the value $P0_A$, $P2_A$, or $P3_A$ meet or exceed either the first read threshold 210 or the second read threshold 220. Accordingly, scan determining component 113 can perform a single-plane scan to determine a first error rate of the data block on plane P1. In other embodiments, scan determining component 113 can instead perform a multi-plane scan to determine error rates of the data blocks in the current stripe one two or more of the planes P0, P1, P2, and P3.

Graph 250 in FIG. 2B illustrates read count values 255 for the same group of associated data blocks across planes P0, P1, P2, and P3 in memory component 112A. The read count values 255 may illustrate the read counts at a later point in time, such that one or more of the read count values 255 may have increased with respect to the read count values 205 shown in graph 200 of FIG. 2A. For the embodiment illustrated in graph 250, the value $P1_B$ exceeds the first read threshold 210. Scan determining component 113 may further determine that the values $P0_B$ and $P2_B$ are below the first read threshold 210 but meet or exceed the second read threshold 220 (i.e., the values $P0_B$ and $P2_B$ are within overkill window 230), indicating that corresponding data blocks on planes P0 and P2 have read count values that exceed the second read threshold 220. In response, scan determining component 113 can perform a multi-plane scan to determine error rates of the data blocks in the stripe in at least planes P0, P1, and P2. In one embodiment, the multi-plane scan includes data blocks in the stripe where the corresponding read count values 255 meet or exceed the second read threshold 220, even though those read count values do not meet or exceed first read threshold 210. In another embodiment, the multi-plane scan includes data blocks in each of the planes P0, P1, P2, and P3 on memory component 112A, even though the read count value $P3_B$ may not even meet the second read threshold 220. In one embodiment, read count values 205 and 255, first read threshold 210 and second read threshold 220, and the error threshold are all stored in local memory 119 of controller 115, where they are accessible by scan determining component 113.

As part of the multi-plane scan, all of the blocks in the stripe across planes P0, P1, P2, and P3 can be scanned in parallel. The multi-plane scan can take a certain amount of time (e.g., 110 microseconds) and transferring the data to the controller may take a certain amount of transfer time (e.g., 10 microseconds for each plane). Thus, the total time for the multi-plane scan of all four planes P0, P1, P2, and P3 may be approximately 150 microseconds, which is considerably less than performing even two individual single plane scans (e.g., 110 microseconds each).

Figure 3:
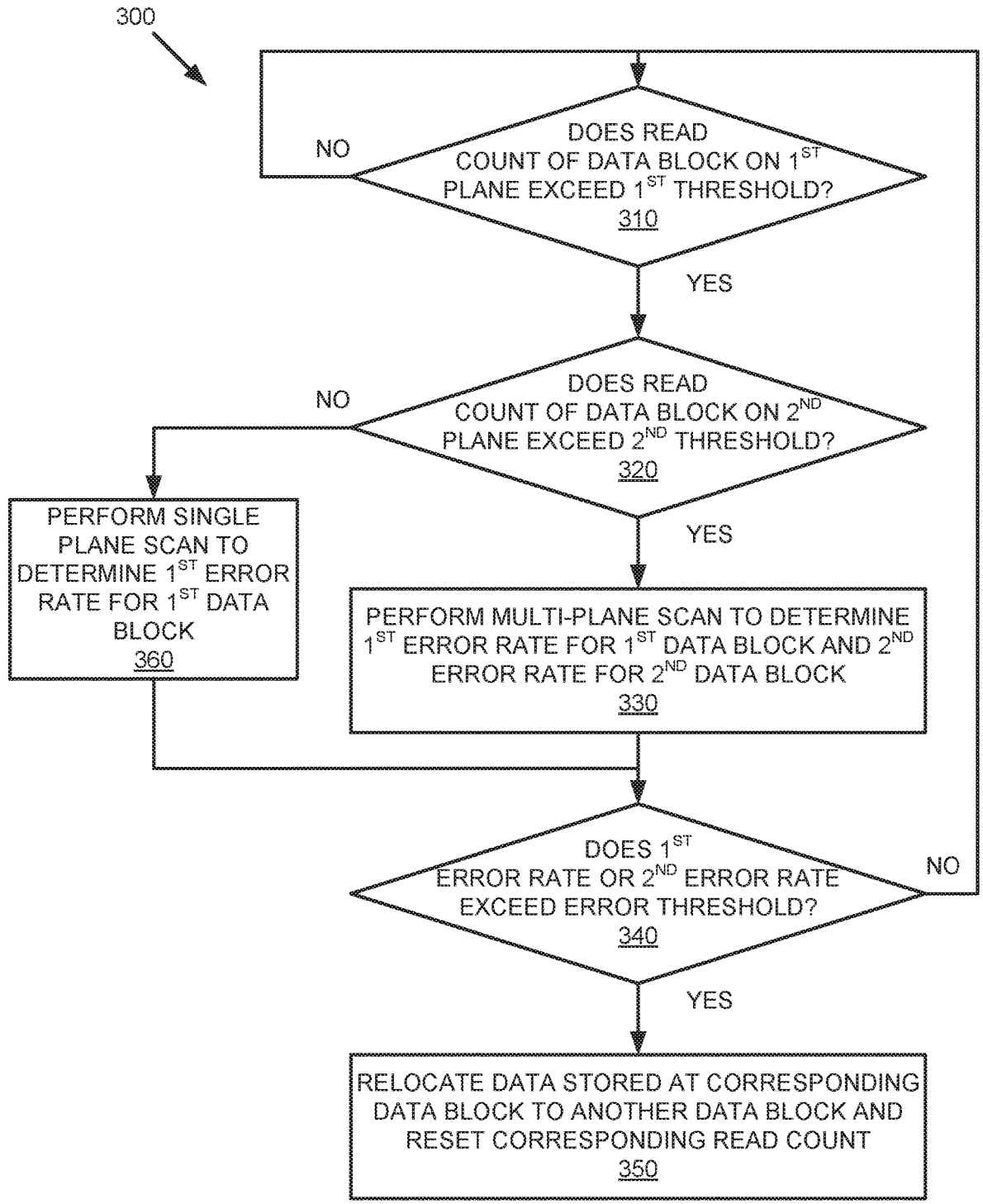
FIG. 3 is a flow diagram of an example method to consolidate read disturb scanning in a multi-plane scan performed across multiple planes of a memory component simultaneously in accordance with some embodiments of the present disclosure.

FIG. 3 is a flow diagram of an example method to consolidate read disturb scanning in a multi-plane scan performed across multiple planes of a memory component simultaneously in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the scan determining component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device determines whether a first read count $P1_A$ or $P1_B$ of a first data block on a first plane P1 of a memory component 112A satisfies a first threshold criterion (i.e., meets or exceeds a first read threshold 210). The first read count $P1_A$ or $P1_B$ represents a number of times that the first data block on plane P1 has been read since a previous scan operation or data integrity check was performed on the first data block, at which time the first read count $P1_A$ or $P1_B$ would have been reset. The first read threshold 210 may represent a number of read operations on a given memory block after which a scan or other data integrity check should be performed. In one embodiment, scan determining component 113 compares the first read count $P1_A$ or $P1_B$ to the first read threshold 210 to determine whether the first read count $P1_A$ or $P1_B$ meets or exceeds the first read threshold 210. If the first read count $P1_A$ or $P1_B$ does not meet or exceed the first read threshold 210, the processing device returns to operation 310 and continues monitoring the read count values 205 or 255 of the data blocks on memory component 112A. In another embodiment, the first threshold criterion includes the first read count $P1_A$ or $P1_B$ being below the first read threshold 210, such that if the first read count $P1_A$ or $P1_B$ does not satisfy the first threshold criterion, the processing device continues to operation 320.

If the first read count $P1_A$ or $P1_B$ meets or exceeds the first read threshold 210, at operation 320, the processing device determines whether a second read count $P2_A$ or $P2_B$ of a second data block on a second plane P2 of the memory component 112A satisfies a second threshold criterion (i.e., meets or exceeds a second read threshold 220). The second read count $P2_A$ or $P2_B$ represents a number of times that the second data block on plane P2 has been read since a previous scan operation or data integrity check was performed on the second data block, at which time the second read count $P2_A$ or $P2_B$ would have been reset. The second read threshold 220 may represent a number of read operations on a given memory block which by itself would not trigger a scan, but indicates that the number of read operations is approaching that level. In one embodiment, scan determining component 113 compares the second read count $P2_A$ or $P2_B$ to the second read threshold 220 to determine whether the second read count $P2_A$ or $P2_B$ meets or exceeds the second read threshold 220. In another embodiment, the second threshold criterion includes the first read count $P1_A$ or $P1_B$ being below the second read threshold 220, such that if the first read count $P1_A$ or $P1_B$ does not satisfy the second threshold criterion, the processing device continues to operation 330.

If the second read count $P2_B$ meets or exceeds a second read threshold 220, at operation 330, the processing device performs a multi-plane scan of at least the associated data blocks on planes P1 and P2 to determine a first error rate for the first data block and a second error rate for the second data block in parallel. In one embodiment, the multi-plane scan includes data blocks in the stripe where the corresponding read count values 255 meet or exceed the second read threshold 220, even though those read count values do not meet or exceed first read threshold 210. In another embodiment, the multi-plane scan includes data blocks in each of the planes P0, P1, P2, and P3 on memory component 112A, even though the read count value $P3_B$ may not even meet the second read threshold 220. In one embodiment, during the scan, scan determining component 113 reads a raw code word (i.e., a series of a fixed number of bits) from each plane of memory component 112A. Scan determining component 113 can apply the code word to an error correcting code (ECC) decoder to generate a decoded code word and compare the decoded code word to the raw code word. Scan determining component 113 can count a number of flipped bits between the decoded code word and the raw code word, with a ratio of the number of flipped bits to the total number of bits in the code word representing the raw bit error rate (RBER). Scan determining component 113 can repeat this process for additional code words until the entire memory component 112A has been scanned.

At operation 340, the processing device determines whether the first error rate or the second error rate satisfies an error threshold criterion (i.e., meets or exceeds an error threshold). The error rate associated with data stored at the data block can increase due to read disturb. Therefore, upon a threshold number of read operations being performed on the data block, the memory sub-system 110 can perform a scan or other data integrity check to verify that the data stored at the data block does not include any errors, or that the number of errors are suitably low. During the scan, scan determining component 113 identifies one or more reliability statistics, such as the raw bit error rate (RBER) representing a number of bit errors per unit of time that the data stored at the data block experiences. In one embodiment, scan determining component 113 compares the error rates to the error threshold which represents an error correction capability of the memory component 112A. If neither the first error rate nor the second error rate meets or exceeds the error threshold, the processing device returns to operation 310 and continues monitoring the read count values 205 or 255 of the data blocks on memory component 112A. In another embodiment, the error threshold criterion includes the first error rate or the second error rate being below the first error threshold, such that if the first error rate or the second error rate does not satisfy the error threshold criterion, the processing device continues to operation 350.

If either the first error rate or the second error rate (or an error rate of a data block on any of planes P1, P2, P3, or P4 that were scanned) meets or exceeds the error threshold, at operation 350, the processing device relocates data stored at a corresponding one of the first data block or the second data block to another data block and resets a corresponding one of the first read count $P1_B$ or the second read count $P2_B$. In one embodiment, scan determining component 113 reads data stored in the corresponding data block (i.e., the data block for which the error rate meets or exceeds the error threshold) writes that data to another data block. Once the data has been written to the other data block, the data stored in the initial data block is erased and the initial data block is available to be programmed with new data. Depending on the embodiment, the data is relocated to another data block of the same plane of the same memory component, to another plane on the same memory component, or to a different memory component of the memory sub-system 110.

If at operation 320, the second read count $P2_A$ does not meet or exceed the second read threshold 220, at operation 360, the processing device performs a single-plane scan of the first data block on plane P1 to determine the first error rate for the first data block. This single-plane scan functions similarly to the multi-plane scan described above except that in the single plane scan only the first data block on plane P1 is scanned.

Figure 4:
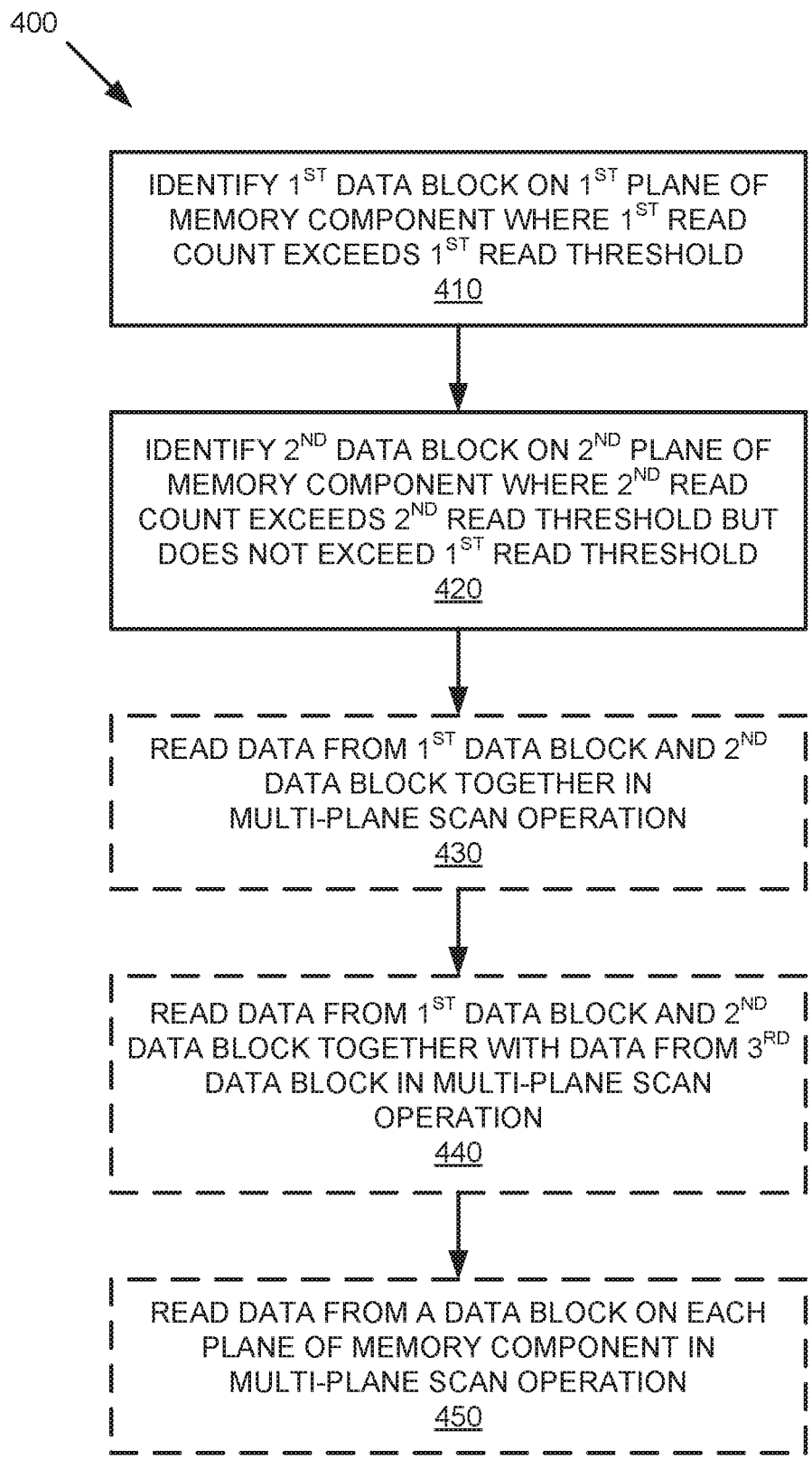
FIG. 4 is a flow diagram of an example method to consolidate read disturb scanning in a multi-plane scan performed across multiple planes of a memory component simultaneously in accordance with some embodiments of the present disclosure.

FIG. 4 is a flow diagram of an example method to consolidate read disturb scanning in a multi-plane scan performed across multiple planes of a memory component simultaneously in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the scan determining component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device identifies a first data block on a first plane P1 of a plurality of planes P1, P2, P3, and P4 of a memory component 112A, wherein a first read count $P1_B$ of the first data block satisfies a first threshold criterion (i.e., meets or exceeds a first read threshold 210). The first read count $P1_B$ represents a number of times that the first data block on plane P1 has been read since a previous scan operation or data integrity check was performed on the first data block, at which time the first read count $P1_B$ would have been reset. The first read threshold 210 may represent a number of read operations on a given memory block after which a scan or other data integrity check should be performed. In one embodiment, scan determining component 113 compares the first read count $P1_B$ to the first read threshold 210 to determine whether the first read count $P1_B$ meets or exceeds the first read threshold 210.

At operation 420, the processing device identifies a second data block on a second plane P2 of the plurality of planes P1, P2, P3, and P4 of the memory component 112A, wherein a second read count $P2_B$ of the second data block satisfies a second threshold criterion (i.e., meets or exceeds a second read threshold 220) and does not satisfy the first threshold criterion (i.e., does not meet or exceed the first read threshold 210). The second read count $P2_B$ represents a number of times that the second data block on plane P2 has been read since a previous scan operation or data integrity check was performed on the second data block, at which time the second read count $P2_B$ would have been reset. The second read threshold 220 may represent a number of read operations on a given memory block which by itself would not trigger a scan, but indicates that the number of read operations is approaching that level. In one embodiment, scan determining component 113 compares the second read count $P2_B$ to the second read threshold 220 to determine whether the second read count $P2_B$ meets or exceeds the second read threshold 220.

At operation 430, the processing device optionally reads data from the first data block and the second data block together as part of a multi-plane scan operation to determine whether an error rate of either the first data block or the second data block meets or exceeds an error correction capability of the memory component 112A. In one embodiment, the multi-plane scan includes data blocks in the stripe where the corresponding read count values $P1_B$ and $P2_B$ meet or exceed the second read threshold 220, even though all of those read count values (e.g., $P2_B$) do not meet or exceed the first read threshold 210.

At operation 440, the processing device optionally reads data from a third data block on a third plane P3 of the memory component 112A together with the data from the first data block and the second data block as part of the multi-plane scan operation, wherein a third read count $P3_B$ of the third data block does not meet or exceed the second read threshold 220. In one embodiment, the multi-plane scan includes data blocks in the stripe where the corresponding read count values 255 meet or exceed the second read threshold 220, as well as at least one data block for which the read count value $P3_B$ does not meet the second read threshold 220.

At operation 450, the processing device optionally reads data from a data block on each of the plurality of planes P1, P2, P3, and P4 as part of the multiplane scan operation to determine whether an error rate of any of the blocks in the stripe satisfies an error threshold criterion (i.e., meets or exceeds the error correction capability of the memory component 112A). In one embodiment, the multi-plane scan includes data blocks in each of the planes P0, P1, P2, and P3 on memory component 112A, even though the read count value $P3_B$, for example, may not even meet the second read threshold 220.

Figure 5:
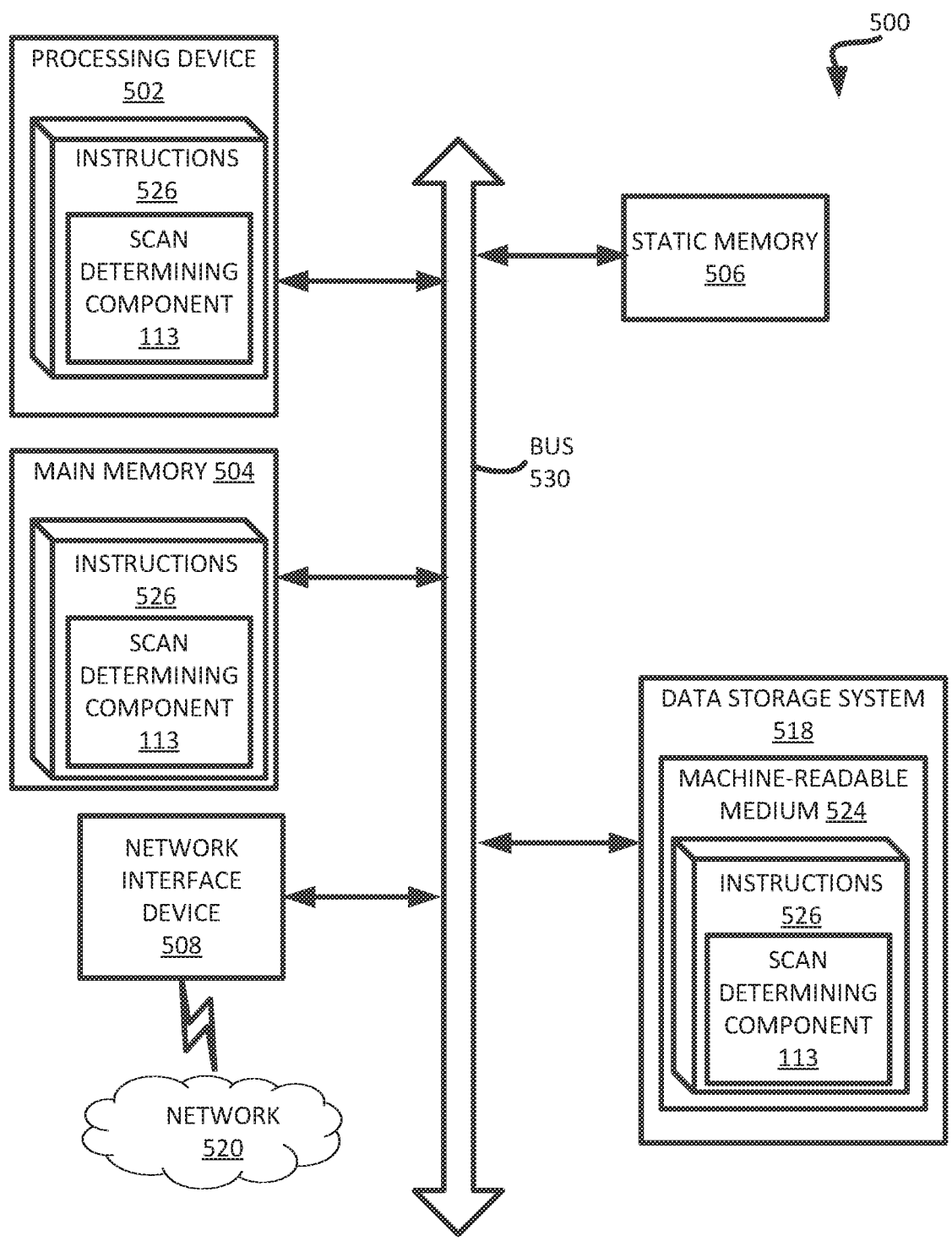
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scan determining component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the scan determining component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to:
determine that a first metric of a first memory unit on a first plane of the memory device satisfies a first threshold criterion;
determine whether a second metric of a second memory unit on a second plane of the memory device satisfies a second threshold criterion and does not satisfy the first threshold criterion; and
responsive to the second metric satisfying the second threshold criterion and not satisfying the first threshold criterion, perform a multi-plane data integrity operation to determine a first reliability statistic for the first memory unit and a second reliability statistic for the second memory unit in parallel.

2. The system of claim 1, wherein to perform the multi-plane data integrity operation, the processing device to scan a third memory unit on a third plane of the memory device in parallel with the first memory unit and the second memory unit, wherein the third memory unit is associated with the first memory unit and the second memory unit, and wherein a third metric of the third memory unit does not satisfy the second threshold criterion.

3. The system of claim 2, wherein the first memory unit, the second memory unit, and the third memory unit are arranged in a stripe across a plurality of planes of the memory device.

4. The system of claim 1, wherein to perform the multi-plane data integrity operation, the processing device to:
determine whether the first reliability statistic satisfies an error threshold criterion; and
responsive to the first reliability statistic satisfying the error threshold criterion:
relocate data stored at the first memory unit to another memory unit on the first plane; and
reset the first metric of the first memory unit to an initial value.

5. The system of claim 1, wherein to perform the multi-plane data integrity operation, the processing device to scan a corresponding memory unit on each plane of the memory device.

6. The system of claim 1, further comprising:
responsive to the second metric not satisfying the second threshold criterion, perform a single-plane data integrity operation to determine the first reliability statistic for the first memory unit.

7. The system of claim 1, wherein the second threshold criterion is in a range of ten percent to twenty percent lower than the first threshold criterion.

8. A method comprising:
identifying a first memory unit on a first plane of a plurality of planes of a memory device, wherein a first metric for the first memory unit satisfies a first threshold criterion;
identifying a second memory unit on a second plane of the plurality of planes, wherein a second metric for the second memory unit satisfies a second threshold criterion and does not satisfy the first threshold criterion; and
reading data from the first memory unit and the second memory unit together as part of a multi-plane data integrity operation to determine whether a reliability statistic of either the first memory unit or the second memory unit satisfies an error correction capability of the memory device.

9. The method of claim 8, further comprising:
reading data from a third memory unit on a third plane of the memory device together with the data from the first memory unit and the second memory unit as part of the multi-plane data integrity operation, wherein a third metric of the third memory unit does not satisfy the second threshold criterion.

10. The method of claim 9, wherein the first memory unit, the second memory unit, and the third memory unit are arranged in a stripe across the plurality of planes of the memory device.

11. The method of claim 8, further comprising:
responsive to the reliability statistic satisfying the error correction capability of the memory device, relocating data stored at a corresponding one of either the first memory unit or the second memory unit to another memory unit on the memory device and resetting either the first metric or the second metric to an initial value.

12. The method of claim 8, further comprising:
reading data from a corresponding memory unit on each plane of the plurality of planes of the memory device as part of the multi-plane data integrity operation.

13. The method of claim 8, further comprising:
responsive to the second metric not satisfying the second threshold criterion, reading data from the first memory unit as part of a single-plane data integrity operation.

14. The method of claim 8, wherein the first metric indicates a number of times that the first memory unit has been read since a previous data integrity operation was performed on the first memory unit.

15. A non-transitory computer-readable storage medium comprising instructions that, when executed by a processing device, cause the processing device to:
determine that a first metric of a first memory unit on a first plane of a memory device satisfies a first threshold criterion;
determine whether a second metric of a second memory unit on a second plane of the memory device satisfies a second threshold criterion and does not satisfy the first threshold criterion; and
responsive to the second metric satisfying the second threshold criterion and not satisfying the first threshold criterion, perform a multi-plane data integrity operation to determine a first reliability statistic for the first memory unit and a second reliability statistic for the second memory unit in parallel.

16. The non-transitory computer-readable storage medium of claim 15, wherein to perform the multi-plane data integrity operation, the processing device to scan a third memory unit on a third plane of the memory device in parallel with the first memory unit and the second memory unit, wherein the third memory unit is associated with the first memory unit and the second memory unit, and wherein a third metric of the third memory unit does not satisfy the second threshold criterion.

17. The non-transitory computer-readable storage medium of claim 16, wherein the first memory unit, the second memory unit, and the third memory unit are arranged in a stripe across a plurality of planes of the memory device.

18. The non-transitory computer-readable storage medium of claim 15, wherein to perform the multi-plane data integrity operation, the processing device to:
determine whether the first reliability statistic satisfying an error threshold criterion; and
responsive to the first reliability statistic satisfying the error threshold criterion:
relocate data stored at the first memory unit to another memory unit on the first plane; and
reset the first metric of the first memory unit to an initial value.

19. The non-transitory computer-readable storage medium of claim 15, wherein to perform the multi-plane data integrity operation, the processing device to scan a corresponding memory unit on each plane of the memory device.

20. The non-transitory computer-readable storage medium of claim 15, wherein the instructions further cause the processing device to:
responsive to the second metric not satisfying the second threshold criterion, perform a single-plane data integrity operation to determine the first reliability statistic for the first memory unit.

* * * * *